(12) United States Patent
Soppera et al.

(10) Patent No.: US 11,054,579 B2
(45) Date of Patent: Jul. 6, 2021

(54) METHOD FOR MAKING A SELF-ALIGNED OPTICAL GUIDE BETWEEN AN OPTICAL SOURCE AND AN OPTICAL FIBER, AND RELATED KIT

(71) Applicants: CENTRE NATIONAL DE LA RECHERCHE SCIENTIFIQUE, Paris (FR); UNIVERSITE DE HAUTE ALSACE, Mulhouse (FR); UNIVERSITE PAUL SABATIER TOULOUSE III, Toulouse (FR)

(72) Inventors: Olivier Soppera, Mulhouse (FR); Véronique Bardinal, Castelmaurou (FR); Frédéric Diot, Le Blanc Mesnil (FR); Thierry Camps, Toulouse (FR); Benjamin Reig, Toulouse (FR); Carole Ecoffet, Mulhouse (FR); Emmanuelle Daran, Pin-Balma (FR); Jean-Baptiste Doucet, Toulouse (FR)

(73) Assignees: CENTRE NATIONAL DE LA RECHERCHE SCIENTIFIQUE, Paris (FR); UNIVERSITE DE HAUTE ALSACE, Mulhouse (FR); UNIVERSITE PAUL SABATIER TOULOUSE III, Toulouse (FR)

( * ) Notice: Subject to any disclaimer, the term of this patent is extended or adjusted under 35 U.S.C. 154(b) by 498 days.

(21) Appl. No.: 16/062,095

(22) PCT Filed: Dec. 16, 2016

(86) PCT No.: PCT/EP2016/081534
§ 371 (c)(1),
(2) Date: Jun. 13, 2018

(87) PCT Pub. No.: WO2017/103178
PCT Pub. Date: Jun. 22, 2017

(65) Prior Publication Data
US 2020/0310032 A1 Oct. 1, 2020

(30) Foreign Application Priority Data

Dec. 17, 2015 (EP) .................... 15307046

(51) Int. Cl.
G02B 6/138 (2006.01)
G02B 6/42 (2006.01)
G03F 7/20 (2006.01)

(52) U.S. Cl.
CPC .......... *G02B 6/138* (2013.01); *G02B 6/4206* (2013.01); *G02B 6/4212* (2013.01); *G03F 7/2004* (2013.01); *G03F 7/2012* (2013.01)

(58) Field of Classification Search
CPC .... G02B 6/138; G02B 6/4206; G02B 6/4212; G03F 7/2004; G03F 7/2012
See application file for complete search history.

(56) References Cited

U.S. PATENT DOCUMENTS

2005/0271336 A1  12/2005  Galstian et al.
2016/0072585 A1* 3/2016  Halderman .......... G02B 6/4204
                                                                398/141

FOREIGN PATENT DOCUMENTS

EP       1 503 231 A1   2/2005
WO       01/96915 A2    12/2001
WO       2012/010776 A1  1/2012

OTHER PUBLICATIONS

Sugihara, et al., "Light-Induced Self-Written Polymeric Optical Waveguides for Single-Mode Propagation and for Optical Interconnections", IEEE Photonics Technology Letters, IEEE Service Center, Piscataway, NJ, US, vol. 16, No. 3, pp. 804-806, Mar. 1, 2004, XP011108314.

* cited by examiner

*Primary Examiner* — John Bedtelyon
(74) *Attorney, Agent, or Firm* — BakerHostetler (57) ABSTRACT

A method includes placing a fluid guide forming composition in contact with the optical source and with the optical (Continued)

fiber, injecting a first light in the guide forming composition from the optical source and/or from the optical fiber, to harden a central region of the optical guide, illuminating the guide forming composition with the second light to harden a peripheral region of the optical guide by photopolymerization initiated by the second photoinitiator system. The difference between the first peak wavelength and the second peak wavelength being more than 100 nm.

18 Claims, 4 Drawing Sheets

METHOD FOR MAKING A SELF-ALIGNED OPTICAL GUIDE BETWEEN AN OPTICAL SOURCE AND AN OPTICAL FIBER, AND RELATED KIT

CROSS-REFERENCE TO RELATED APPLICATIONS

This application is a National Stage of International patent application PCT/EP2016/081534, filed on Dec. 16, 2016, which claims priority to foreign European patent application No. EP 15307046.1, filed on Dec. 17, 2015, the disclosures of which are incorporated by reference in their entirety.

FIELD OF THE INVENTION

The present invention concerns a method for making a self-aligned optical guide between an optical source producing a directional emission and an optical fiber, comprising the following steps:

arranging the optical source and the optical fiber facing one another and defining an intermediate space between them;

placing, in the intermediate space, a fluid guide forming composition in contact with the optical source and with the optical fiber, the guide forming composition comprising at least a first monomer, and a first photoinitiator system able to activate the polymerization of at least the first monomer when illuminated with a first light;

injecting a first light in the guide forming composition from the optical source and/or from the optical fiber, to harden a central region of the optical guide by photopolymerization initiated by the first photoinitiator system, the central region connecting the optical source and the optical fiber.

BACKGROUND

Such a method is intended for connecting with high efficiency an optical source emitting a directional light with an optical fiber. The optical fiber is either a single mode fiber or a multimode fiber.

The optical source is in particular a Vertical-Cavity Surface-Emitting Laser or VCSEL.

Optical laser sources emitting a directional beam have undergone considerable developments in the past years. These optical coherent sources have numerous advantages in particular over light emitting diodes. VCSELs are quite easy to manufacture collectively because of their all-vertical geometry which keeps manufacturing costs low. They are easy to integrate in semi-conductor manufacturing.

Such components are also very reliable, and have a very long lifetime. Additionally, they operate with a low threshold current, providing low power consumption while delivering high quality optical beam.

Optical sources such as VCSELs must be coupled to optical fibers for a large number of remote applications. The coupling between the optical source and the optical fiber is a critical step, which is quite difficult to achieve with good quality of coupling. In order to obtain an adequate power transmission, it is necessary to very precisely align the beam emitted by the VCSEL with the core of the optical fiber. The alignment is quite tricky to obtain and can be costly. Also, it is difficult to maintain this coupling in time.

If the alignment is not perfect, the transmitted power is lower, and the optical source must be used with a higher pumping level to compensate the loss of optical power. This can also affect beam optical properties.

In order to alleviate such problems, the article of KAGAMI et al. in Applied Physics Letters, Volume 79, n° 8, Aug. 20, 2001 discloses the forming of an optical guide between an optical source and an optical fiber. The guide is made from two incompatible resins having different optical indices. As reported by KAGAMI, a micro phase separation occurs during the polymerization of the resins, which induces optical losses in the material when the connection is made. The method is only able to connect a multimode fiber with the optical source. Moreover, both resins are polymerized in the UV or visible field.

WO 2012/010776 discloses a method of coupling optical fibers by creating a guide between the fibers. The method involves placing a first resin in the intermediate space, and carrying out a polymerization of the first resin.

The remaining resin is then removed, before placing a second resin to be polymerized around the polymerized core. Such a method is tedious to operate because the first resin must be removed before the polymerization of the second resin can be carried out.

SUMMARY OF THE INVENTION

One aim of the invention is to obtain a very simple, reliable and effective connection between an optical source having a directional emission and an optical fiber.

To this aim, the invention concerns a method as disclosed above, characterized in that:

the first light has a first peak wavelength, the guide forming composition comprising a second photoinitiator system, the second photoinitiator system being able to be activated when illuminated with a second light having a second peak wavelength;

the method comprising a step of illuminating the guide forming composition with the second light to harden a peripheral region of the optical guide by photopolymerization initiated by the second photoinitiator system, the difference between the first peak wavelength and the second peak wavelength being more than 100 nm.

The method according to the invention may comprise one or more of the following features, taken alone or according to any technical combination;

the first light has a peak wavelength of at least 650 nm, the second light having a peak wavelength of strictly less than 650 nm;

the first light has a peak wavelength comprised between 700 nm and 1600 nm;

the first light has a peak wavelength comprised between 700 nm and 900 nm, advantageously close to or equal to 800 nm;

the first light has a peak wavelength comprised between 1200 nm and 1400 nm, advantageously close to or equal to 1300 nm;

the second light has a peak wavelength of less than 450 nm;

the first monomer is an acrylate monomer;

the guide forming composition comprises a second acrylate monomer distinct from the first acrylate monomer;

one of the first and the second acrylate monomers is a diacrylate, the other one of the first and the second acrylate monomers being a triacrylate, the first acrylate monomer comprising advantageously an epoxy bisphenol A diacrylate oligomer and the second acrylate monomer comprising advantageously a branched triacrylate.

both the first and the second acrylate monomers are diacrylates, the first acrylate monomer being advantageously an epoxy bisphenol A diacrylate and the second acrylate monomer being advantageously a tri-propylene glycol diacrylate;

the difference between the optical index along the axis of the optical guide in the central region and at the periphery of the optical guide in the peripheral region after hardening of the central region and of the peripheral region is greater than $5×10^{-4}$;

the first photoinitiator system comprises at least a photosensitizer, and an initiator;

the injection of the first light is done simultaneously through the optical source and through the optical fiber;

the light power density of the first light injected through the optical source is different of more than 20% from the power of the first light injected through the optical fiber;

the light power density of the first light injected in the guide forming composition is between 100 W/cm² and 10 KW/cm²;

the optical source is chosen among a VCSEL and an additional optical fiber;

the optical fiber is a single mode optical fiber;

at least after the injection of the first light, the optical guide is flexible, the method comprising a step of bending the optical guide to form a bend between a first end portion of the optical guide connected to the optical source and a second end portion of the optical guide connected to the optical fiber.

The method also comprises a kit for making a self-aligned optical guide between an optical source and an optical fiber, comprising:

an optical source and an optical guide intended for being arranged facing one another and for defining an intermediate space between them;

a fluid guide forming composition intended for being placed in contact with the optical source and the optical fiber, the guide forming composition comprising at least a first monomer, and a first photoinitiator system able to activate the photopolymerization of the first monomer when illuminated with a first light;

the optical source being able to inject a first light in the guide forming composition, to harden a central region of the optical guide by photopolymerization initiated by the first photoinitiator system;

characterized in that the first light has a first peak wavelength, the guide forming composition comprising a second photoinitiator system, the second photoinitiator system being able to be activated when illuminated with a second light having a peak wavelength;

the kit comprising a second light source, able to illuminate the guide forming composition to harden a peripheral region of the optical guide by photopolymerization initiated by the second photoinitiator system the difference between the first peak wavelength and the second peak wavelength being more than 100 nm.

BRIEF DESCRIPTION OF THE DRAWINGS

The invention will be better understood upon reading the following description, taken solely as an example, and made in reference to the appended drawings, in which.

DETAILED DESCRIPTION

A method for making a self-aligned optical guide 10 according to the invention is illustrated in FIGS. 1 to 7. The optical guide 10 extends between an optical source 12 producing a directional emission and an optical fiber 14.

The optical source 12 producing a directional emission is for example a laser source, in particular a vertical cavity surface emitting laser source or "VCSEL".

The VCSEL is a type of semi-conductor laser diode, with a laser beam emission perpendicular to the top surface. The laser source advantageously has a low threshold current, for example lower than 1 mA for GaAs-based oxide-confined VCSELs. It emits advantageously a beam with a circular symmetry. Potentially, the VCSEL can have an emitting wavelength comprised between 400 nanometers (nm) up to 2600 nm, but best performances are obtained in the range from 650 nm to 1550 nm.

The emitting surface of the VCSEL is comprised between 10 µm² and 1 mm². A light power density emitted by the VCSEL is for example comprised between 100 W/cm² and 10 kW/cm².

The optical fiber 14 comprises a core 16 and a cladding 18. In a preferred embodiment, the optical fiber 14 is a single mode optical fiber. The core 16 diameter is then advantageously comprised between 3 µm and 10.5 µm. Cladding diameter is generally comprised between 100 µm and 200 µm.

In a variant, the optical fiber 14 is a multimode fiber. The core diameter 16 is then much larger, typically comprised between 50 µm and 1000 µm, the cladding diameter being generally comprised between 100 µm and 2000 µm.

Figure 1:
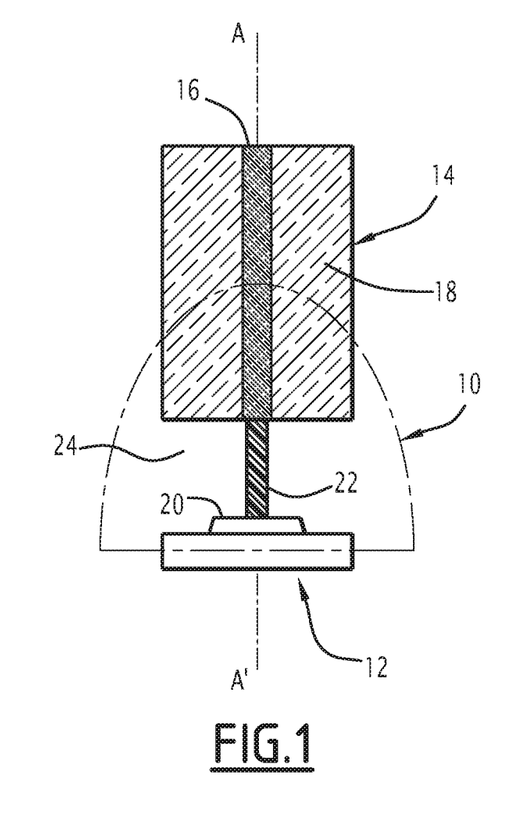
FIG. 1 is a schematic view of a first optical guide between an optical source and an optical fiber made with the method according to the invention.

In reference to FIG. 1, the optical guide 10 comprises a central region 22 which has an optical index higher than a peripheral region 24.

The difference between the optical index along the axis A-A' of the guide 10 in the central region 22 and the periphery of the guide 10 in the peripheral region 24, after total hardening of the guide forming composition in the central region 22 and in the peripheral region 24 is greater than $5×10^{-4}$.

As shown in FIG. 1, the core 22 of the optical guide 10 connects the central part 20 of the optical source 12 with the core 16 of the optical fiber 14.

The optical guide 10 is by construction centered on the axis A-A' of the optical fiber 14 and the axis A-A' of the source 12.

In the example illustrated in FIG. 1, the core 16 of the optical fiber 14, the guide 10 and the source 12 are co-axial. They extend along a common axis A-A'. The guide 10 extends linearly along the axis A-A'.

In one embodiment, such as in FIG. 1, the guide 10 is made of a rigid polymer which is not manually stretchable.

Figure 8:
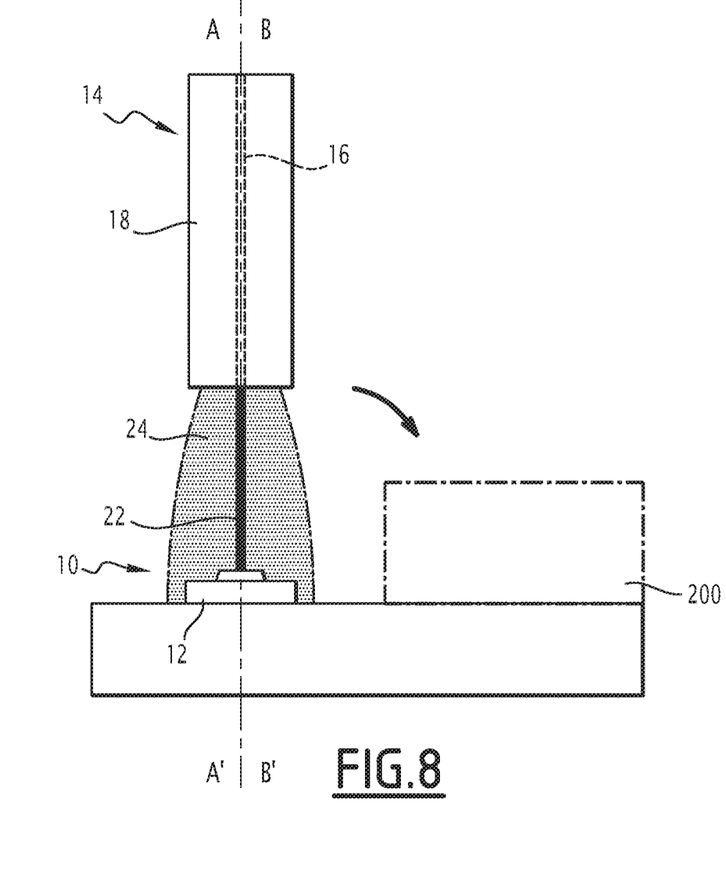
FIG. 8 is another configuration of the optical guide according to the invention, before bending of the guide.
Figure 9:
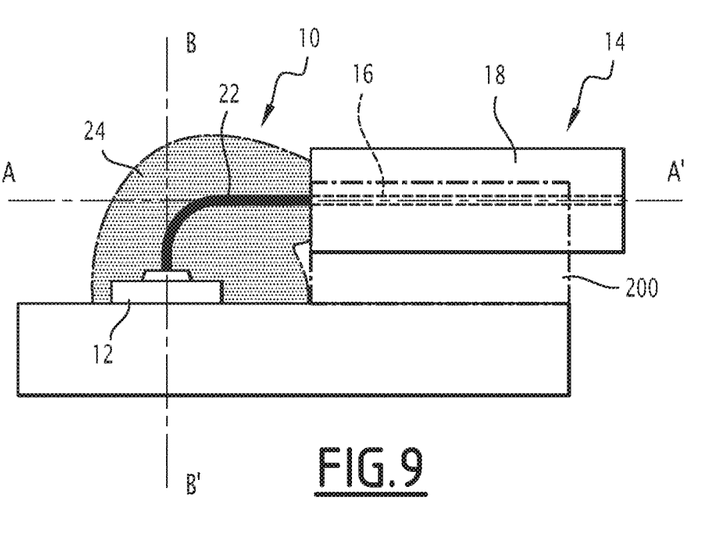
FIG. 9 is a view similar to FIG. 8, after bending of the guide and fabrication of the cladding.

In a variant shown in FIG. 9, the axis A-A' of the optical fiber 14 makes an angle which can be comprised between 0° and 90°, in particular between 5° and 90° with the axis B-B' of the source 12. The core 22 is then bent before polymerization of the cladding 24, as shown in FIG. 8. The guide 10 has an end connected to the source 12, which is coaxial with the source 12 and an end connected to the optical fiber 14 which is coaxial with the optical fiber 14.

In this variant, the core 22 is preferably made of elastomeric polymer, which is manually bendable. The manufacturing process of this particular variant will be described later.

The guide 10 is able to provide guidance for the light beam emitted by the source 12 to transmit its power to the optical fiber. It is able to provide a transmission of at least 30%, in particular more than 50% of the power emitted by the source 12 to the optical fiber 14. Thanks to the invention, this result can be obtained with a greater distance between the source 12 and the optical fiber 14 (e.g. greater than when a "butt coupling" is made), and/or with standard optical fibers whose dimensions are not adapted to the emmision size of the source 12.

The length of the guide 10, taken along axis A-A' between the optical source 12 and the optical fiber 14 is generally comprised between 50 μm and 1000 μm. It is preferentially comprised between 100 μm and 300 μm.

Figure 4:
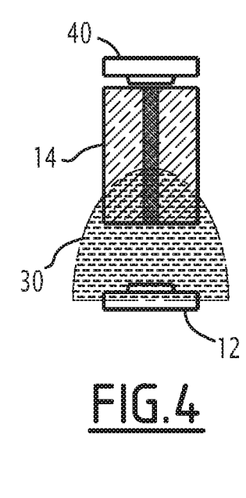

In the method according to the invention, the guide 10 is made from a guide forming composition 30 shown for example in FIG. 4, which is photopolymerized.

The guide forming composition comprises at least a monomer, able to photopolymerize, a first photoinitiator system, able to initiate the photopolymerization of the or each monomer when submitted to a first light at a first peak wavelength and a second photoinitiator system able to be activated when illuminated with a second light having a second peak wavelength, the difference between the first peak wavelength and the second peak wavelength being more than 100 nm.

Advantageously, the monomer comprises at least an acrylate and/or a methacrylate monomer. Preferably, the guide forming composition comprises at least an acrylate monomer. Polymerization of an acrylate monomer can be inhibited in contact with oxygen at the periphery of the guide forming composition 30, which confines the polymerization reaction in the central region of the guide forming composition 30. The confinement of the polymerization is also a result of the so-called "self-guiding" effect that is the result of the increase of refractive index during photopolymerization.

Preferably, the formulation comprises a diacrylate monomer, more preferably an epoxy diacrylate monomer such as a bisphenol-A-epoxy-diacrylate or tri-propylene glycol diacrylate. A suitable compound is available under the tradename Ebecryl® 600.

Preferably, the monomer(s) are chosen to provide a refraction index adapted to the index of the core 16 of the optical fiber 14 to limit the reflection losses at the interface between the guide 10 and the optical fiber 14. The monomer(s) are also chosen to provide adequate mechanical properties to make the guide 10 rigid or flexible.

The polymerization of the monomer(s) induces an index gradient, between the central part 22 and the peripheral part 24 of the guide 10, after polymerization.

The viscosity and surface energy of the monomer(s) before polymerization is chosen to allow its dispensing, while providing a sufficient mechanical strength to be able to self-support.

The viscosity is for example comprised between 1 mPa·s and 50000 mPa·s (at 25° C. and ambient pressure) as measured by standard cone plate viscosimeter.

In particular, the guide forming composition 30 comprises at least a cross linkable multifunctional monomer chosen in the group formed by:

monomer(s) polymerizable by radical polymerization, preferably based on vinyl or (meth)acrylate monomers, monomers polymerizable by cationic polymerization, monomers polymerizable by anionic polymerization, preferably based on epoxy or thiol-ene;

photopolymerizable hybrid materials such as sol-gel hybrid materials prepared from a precursor, preferably a silane compound, in particular 3-methacryloxypropyl trimethoxysilane or 3-glycidyloxypropyltrimethoxysilane.

Preferably, the monomer is a mono-, di-, tri-, tetra- or pentafunctional (meth)acrylate monomer and more advantageously, a mono-, di-, tri-, tetra- or pentafunctional acrylate.

In a first very advantageous embodiment, the guide forming composition 30 comprises a mixture of two different diacrylate monomers. More preferably, the guide forming composition 30 comprises mixture of a diacrylate monomer, such as a bisphenol-A-epoxy-diacrylate oligomer, diluted with a tri-propylene glycol diacrylate monomer. A suitable compound is available under the tradename Ebecryl® 605.

In a second very advantageous embodiment, the guide forming composition 30 comprises a mixture of a diacrylate monomer and of a triacrylate monomer. In particular, the acrylate monomer comprises a mixture of an epoxy diacrylate and of a propylene glycol diacrylate. More preferably, the guide forming composition 30 comprises mixture of a diacrylate monomer, such as a bisphenol-A-epoxy-diacrylate oligomer, diluted with a tri-propylene glycol diacrylate monomer.

The triacrylate monomer is for example a polyol acrylate monomer. Preferably, the triacrylate is a pentaerythritol triacrylate.

The mass ratio of the diacrylate monomer in the guide forming composition 30 is comprised preferably between 51% and 80%, more preferably between 60% and 80%.

The corresponding mass ratio of triacrylate monomer is comprised between 10% and 49%, preferably between 20% and 40%.

The first photoinitiator system is able to be activated by a first light produced by the source 12 and/or conveyed by the optical fiber 14. It has an absorption spectrum adapted to the emission of the source 12.

Preferably, the absorption spectrum of the first photoinitiator system is comprised between 500 nm and 1600 nm, and more preferably between 700 nm and 1600 nm. This spectrum is located in the near infra-red range.

In a first advantageous embodiment, the absorption spectrum of the first photoinitiator system is comprised between 700 nm and 1000 nm, advantageously between 700 nm and 900 nm and more advantageously close to or equal to 800 nm.

In a second advantageous embodiment, the absorption spectrum of the first photoinitiator system is comprised between 1200 nm and 1400 nm, advantageously close to or equal to 1300 nm.

Advantageously, the first photoinitiator system comprises an association of two types of compounds functioning by hydrogen abstraction and/or electron transfer. At least one compound is an initiator, and at least another compound is a photosensitizer.

The photosensitizer compounds are preferably chosen in the group formed by acridines, preferably acryflavine or orange acridine, phenazines, preferably Safranine O, oxayzines, thiazines, preferably methylene blue or thionine, xantenes, thioxantenes preferably Y Eosine, Bengal Pink, or erythrozine, rhodamines, cetocumarines, thioxantones, and polymethines.

Preferably, when absorption is sought in the near infrared range, the photo sensitizer compound is an organic dye such as a polymethine, in particular a cyanine. The cyanine is preferably a carbocyanine, a phtalocyanine, a naphtalocyanine with various counter ions, such as iodides, perchlorates, and metal complexes from these dyes, such as cobalt, aluminium, copper, iron, lead, magnesium, nickel, silicon, tin, titanium, vanadium or zinc metal complexes.

In particular, the compound is an indotricarbocyanine (HITC). The combination of indotricarbocyanine and methyl diethanolamine is preferred.

The mass content of photosensitizer in the guide forming composition 30 is preferably comprised between 0.01% and 0.5%, more preferably between 0.1% and 0.5%, even more preferably between 0.1% and 0.3% The mass content of initiator in the guide forming composition 30 is preferably comprised between 0.5% and 10%, more preferably between 2% and 10%, even more preferably between 3% and 5%.

The initiator is a compound with physico-chemical properties allowing it to undergo a hydrogen abstraction and/or electron transfer from excited state of the photosensitizer. Preferentially, the initiator is chosen in the group formed by amines, the amines being preferably tertiary and more preferably hydroxyl alkylamines, in particular methyl diethanolamine (MDEA), benzylamines, anilines derivatives and in particular ethyl paradimethyl amino benzoate, N-phenyl glycine and/or ascorbic acid.

The second photoinitiator system is able to be activated when illuminated with a second light having a second peak wavelength different from the first peak wavelength of the first photoinitiator.

The second photoinitiator is chosen between the group of Norrish I photoinitiators, chosen among the benzoin ethers, preferably 2,2 dimethoxy-2-phenyl acetophenone or substituted acetophenones, such as 2-hydroxy-2-methyl-1-phenyl propane-1-one or 2-methyl-1-[4-(methyl thio-phenyl]-2-morpholinopropan-1-one.

The second photoiniator can be a two-compounds photoinitiator (Norrish II type) with a photosensitizer compound functioning by energy transfer is chosen in the group formed by thioxantones, in particular iso propyl thioxantones or coumarins and their derivatives and an initiator chosen in the group formed by ascorbic acid, or amines, the amines being preferably tertiary and more preferably hydroxyl alkylamines, in particular methyl diethanolamine, benzylamines, anilines derivatives and in particular, N-phenyl glycine or ethyl paradimethyl amino benzoate.

The second photoinitiator is for example chosen in the group formed by benzoine ethers, substituted acetophenones, derivatives of phosphine oxides, aminocetones, oxysulfonyl ketones, sulfonyl ketones, metallocenes, and more preferentially bis($\eta$-5-2,4 cyclopentadiene-1-yl)-bis-[2,6-difluoro-3-(1H-pyrol-1-yl) phenyl] titanium or one of its derivatives and azo type compounds such as azobisisobutyronitrile (AIBN).

In a particular embodiment, the second photoinitiator is an organophosphorus compound. In particular, it is a phosphine oxide derivative, for example, a bis-acyl phosphine such as phosphine oxide, phenyl bis (2, 4, 6-trimethyl benzoyl).

In particular, the second photoinitiator system does not interact with the first photoinitiator system when the first photoinitiator system is illuminated with a first light. The activity of the second photoinitiator system when submitted to the first light is negligible. This advantageously means than less than 10% of the molecules of the second photoinitiator system are activated when submitted to the first light.

The difference between the first peak wavelength and the second peak wavelength is more than 100 nm.

In particular, the second photo initiator system is able to be activated in the UV or visible range, in particular from 250 nm to 500 nm.

For example, the second photoinitiator system comprises at least a photoinitiator comprising one type of compound functioning directly by a reaction of photoinduced cleavage of the type referred to as "a and/or 13 cleavage".

The mass content of second photoinitiator system in the guide forming composition 30 is for example comprised between 0.1% and 5%, more preferably between 0.5% and 1.5%.

A general example for the guide forming composition 30 is presented below, for a first light with a peak wavelength around 1300 nm. The proportions are in weight percentages:
Monomer: 88.5% to 98.49%;
First photoinitiator system: NIR dye: 0.01 to 0.5; initiator: 0.5 to 10%;
Second UV Photoinitiator: 1%.

The monomer is preferably a mixture of Ebecryl® 600 and Ebecryl® 605, the proportions depending on the desired viscosity of the composition.

The NIR dye is preferably chosen among the following tradenames: IR-1048 (Aldrich); IR-1061 (Aldrich); ADS1065A (American Dye Source, Inc); ADS1075A (American Dye Source, Inc); ADS920MC (American Dye Source, Inc); IR Dye 9117 (Adam Gates & Company); IR Dye 9572 (Adam Gates & Company); IR Dye 1422 (Adam Gates & Company); IR Dye 9110 (Adam Gates & Company); IR Dye 1151 (Adam Gates & Company); IR Dye 1120 (Adam Gates & Company); IR Dye 1117 (Adam Gates & Company); IR Dye 1122 (Adam Gates & Company); Lumogen® IR 1050 (BASF); Pro-Jet™ 900NP (Fujifilm).

The initiator is preferably MDEA.

The second photoinitiator is preferably a two-compound photoinitiator (Norrish II type) as described above.

A preferred example for the guide forming composition 30 is the following:
Ebecryl® 600: 47.4%;
Ebecryl® 605: 47.4%;
NIR dye: 0.2%;
initiator (MDEA): 4%
Second UV Photoinitiator: 1%.
The proportions are in weight percentages.

Figure 2:
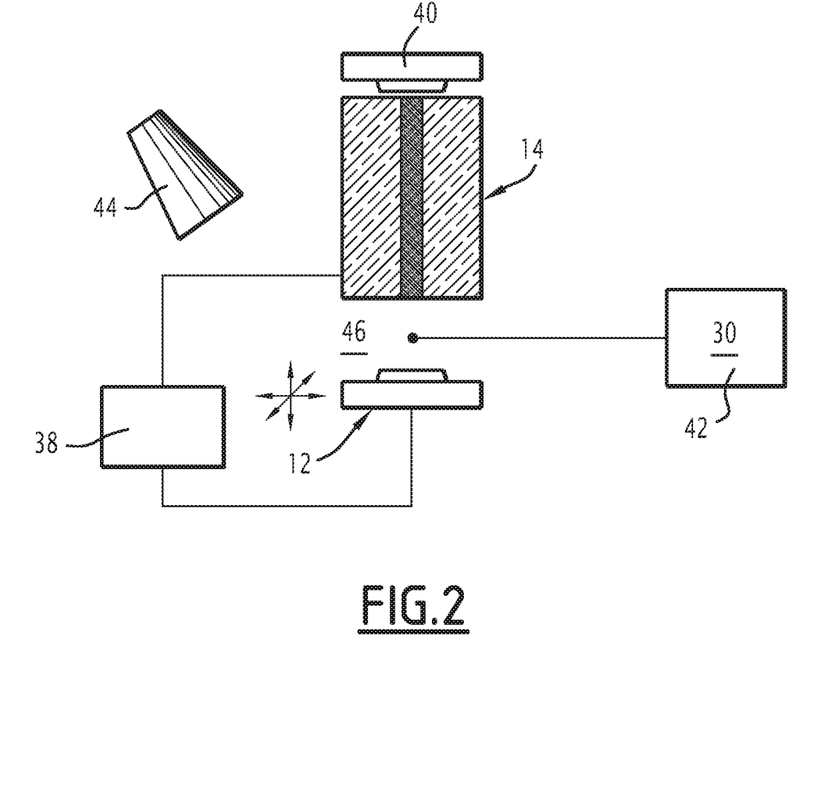
FIG. 2 is a schematic view of a kit necessary for carrying out the method according to the invention.

The method according to the invention is carried out in an apparatus shown in FIG. 2. The apparatus comprises the optical source 12, the optical fiber 14, and a support 38 for mechanically positioning the optical source 12 with regards to the optical fiber 14.

The apparatus preferentially comprises an auxiliary optical source 40 that can be a similar VCSEL connected to the optical fiber 14. It comprises a guide forming composition recipient 42 and a second source 44.

The optical source 12 is able to produce the first light at a first peak wavelength.

As discussed above, the first peak wavelength is preferentially of at least 650 nm, and is advantageously in the NIR range. For the preferred example of guide forming composition 30, described above, the first peak wavelength is preferentially of 1300 nm±10 nm.

The first optical source 12 provides a light, preferably having a circular beam with a light density comprised between 100 W/cm$^2$ and 10 KW/cm$^2$.

The support 38 comprises at least a first support part, supporting the source 12, a second support part, supporting the optical fiber 14 and a positioning apparatus for relatively moving in three dimensions the optical source 14 supported on the first part relatively to the optical fiber 14 carried by the second part.

The auxiliary source 40 emits light at the same peak wavelength as the first source 12.

The fluid forming composition recipient 42 is able to store and deliver the fluid forming composition 30 to the intermediate space 46 between the optical fiber 14 and the first source 12.

The second source 44 is able to illuminate the fluid forming composition located in the intermediate space 46.

It is able to emit a second light as defined above, preferably in the UV range.

A method for making a self-aligned optical guide 10 according to the invention will be now disclosed, in view of FIGS. 3 to 7.

Figure 3:
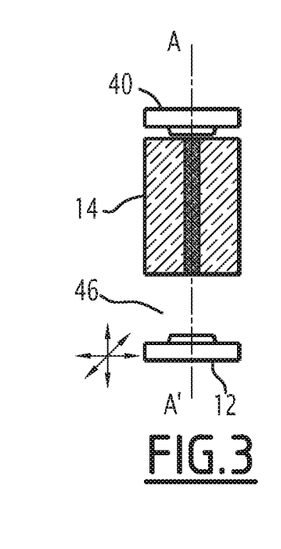
FIGS. 3 to 7 illustrate successive steps of the method according to the invention.

In a first step of the method, shown in FIG. 3, the source 12 is positioned on the first part of the support 38 and the optical fiber 14 is positioned on the second part of the support 38. The axis of the source 12 and the axis of the core 16 of the optical fiber 14 are roughly aligned to coincide.

The tolerance of alignment of the source 12 with regard to the optical fiber 14 is for example comprised between 0 μm and 10 μm.

An intermediate space 46, whose height along axis A-A' is preferably between 0.005 mm and 1 mm is provided between the optical source 12 and a free end of the optical fiber 14 facing the optical source 12.

In a particular variation, the source 12 comprises an intermediate transparent solid layer in the intermediate space 46 in contact with the laser source.

Another end of the optical fiber 14 is connected to the auxiliary source 40, when available.

Subsequently, as shown in FIG. 4, the fluid forming composition 30 is delivered in the intermediate space 46 from the receptacle 42. The intermediate space 46 is here fully filled with composition 30, so that the fluid forming composition 30 continuously links the free end of the optical fiber 14 to the source 12.

Figures 5, 6:
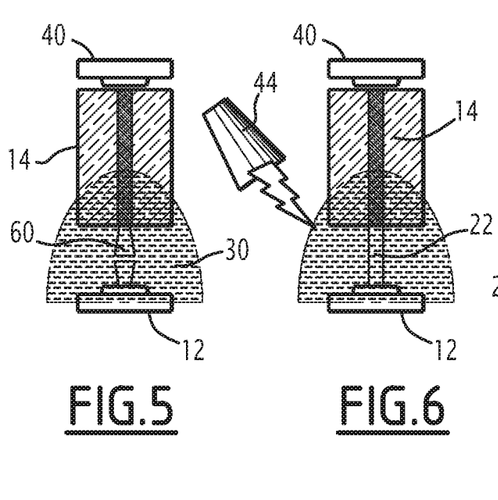
Figure 7:
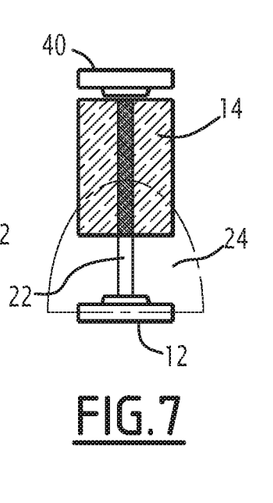

Next, as shown in FIG. 5, the source 12 is activated to produce the first light and to inject it in the center region of the guide forming composition 30 from the source 12 towards the optical fiber 14. Advantageously, when the auxiliary source 40 is available, the auxiliary source 40 is activated simultaneously to inject the first light from the optical fiber 14 towards the source 12.

The wavelength of source 40 should be the same as the wavelength of source 12 and the delivered power density should be in the same order of magnitude (i.e. within 20%) at the extremity of the fiber 14 and at the surface of source 12 to insure a symmetric polymerization kinetics.

The first photoinitiator system contained in the fluid forming composition is activated by the first light. No substantial activation of the second photoinitiator system occurs.

In particular, when the first photoinitiator system comprises a photosensitizer and a initiator, the photosensitizer absorbs the first light produced from the source(s) 12, 40 and produces a singlet. Then, an intersystem crossing occurs, producing a triplet, which reacts with the initiator contained in the photoinitiator system. A free radical is created, which reacts with the monomer(s).

Figure 10:
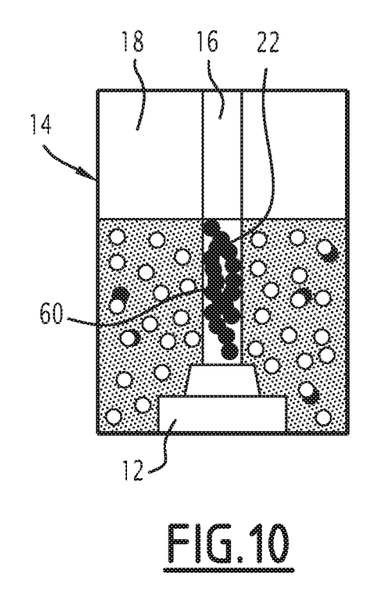
FIG. 10 illustrates the polymerization of the central part of the guide.

In reference to FIG. 10, since the light provided in the guide forming composition 30 from the source 12 is directional along axis A-A', it is contained in a pseudo cylindrical volume 60 located between the tip of the source 12 and the end of the optical fiber 14 at the location where the core 16 of the optical fiber 14 ends. The light emitted by the auxiliary source 14 is injected towards the source 12 in the same cylindrical volume 60.

As shown in FIG. 10, polymerization of the monomer(s) occurs preferentially in the cylindrical volume 60 creating a polymerized central region 22 for the guide forming composition. Because the polymerization increase the refractive index, the cylinder 60 behaves as a waveguide that confines the light and prevent spatial extension of polymerization.

The second photoinitiator system remains substantially unactivated during this step.

The polymerized central region 22 extends linearly along the axis A-A' between the tip of the source 12 and the core 16 of the optical fiber 14.

The guide forming composition 30 remains substantially fluid at the periphery of the central region 22.

Then, as shown in FIG. 6, the second light source 44 is activated to illuminate the periphery of the guide forming composition 30 with a second light different from the first light. The second light has a second peak wavelength whose difference with the first peak wavelength is more than 100 nm. Preferably, the second light has a peak wavelength of strictly less than 650 nm, and preferably of less than 450 nm. It is preferably located in the UV field.

Figure 11:
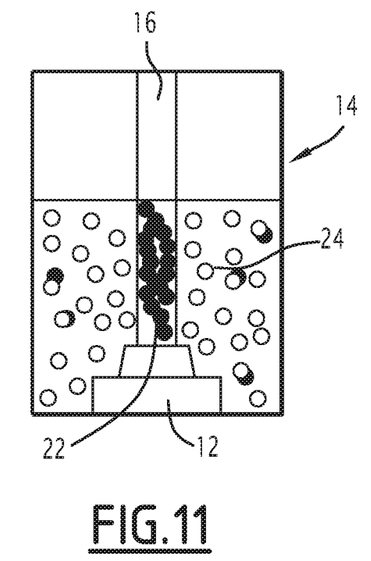
FIG. 11 illustrates the polymerization of the peripheral part of the guide.

The second light activates the second photoinitiator system and induces the polymerization of the monomer(s) in the peripheral region 24. A gradient of index is created radially with regard to the axis A-A' between the central region 22 of the guide 10 and the peripheral part 24.

The cladding material in the peripheral part 24 is polymerized without erasing the gradient of refractive index in the central region 22 and forms a waveguide at the center of the guide 10. This ensures the optical coupling, mechanical anchoring and creates a protection around the waveguide.

In case of simultaneous irradiation by the source 12 and the auxiliary source 40, two waveguides are growing simultaneously respectively from the source 12 and from the optical fiber 14 and collapse together even if the axis of the optical fiber 14 is slightly misaligned with the axis of the optical source 12.

Advantageously, the power densities at the end of emitting source 12 and optical fiber 14 are in the same order of magnitude to guarantee an equivalent growth of both waveguides.

In an optical connection with an intermediate space 46 defining a distance of 100 μm between the optical source 12 and the optical fiber 14, the power transmission from the source is significantly increased when an optical guide 10 is made according to the invention, as compared to a standard coupling in air and even as compared to a coupling in a single polymer droplet, without polymerization of a central region 22 creating a waveguide. The polymerization of the peripheral region 24 also increases the mechanical strength of the optical coupling 10. The transmitted power from the optical source 12 to the optical fiber 14 may be higher than 20%, preferably higher than 50%.

The method according to the invention does not require a perfect alignment between the axis of the optical fiber 14 and the axis of the source 12. Hence, this coupling can be achieved quite easily and efficiently even with a single mode fiber.

The coupling can also be made after a packaging step, once the optical fiber 14 and the source 12 are fixed in the packaging.

The method according to the invention produces very clear index gradient between the center region 22 and the peripheral region 24 of the guide 10. The guide 10 can be built for a wide range of distances between the source 12 and the optical fiber 14.

In a variant, no auxiliary source 40 is used. Light is only injected from the source 12.

In another variant, shown in FIG. 8, polymerization of the central region 22 using the first light is carried out as described previously. Then, as shown in FIG. 9, the axis of the optical fiber 14 is tilted with regard to the axis of the optical source 12 to bend the central region 22. The optical fiber 14 is then secured on a support 200 along an axis A-A' which is inclined or perpendicular to the axis B-B' of the optical source 12.

Light is able to be guided through the waveguide during the bending of the central region 22. The guide 10 remains anchored on the optical fiber 14 surface and on the optical source 12 surface.

In a variation, the optical source 12 comprises an additional optical fiber, the connection is carried out between the optical fiber 14 and the additional optical fiber.

In a variation, the photonic conditions on the optical fiber side 14 and on the optical source 12 are tuned to obtain growth of the guides at the same rate from each of the source 12 and of the optical fiber 14. The surface densities of power are adapted, since the emission surfaces of the optical source 12 and of the optical fiber 14 are different. In a particular example, the light power density of the first light injected through the optical source 12 is not different of more than 20% from the power of the first light injected through the optical fiber 14.

The invention claimed is:

1. A method for making a self-aligned optical guide between an optical source producing a directional emission and an optical fiber comprising:
    arranging the optical source and the optical fiber facing one another and defining an intermediate space between them, the optical source being configured to emit a first light having a first peak wavelength comprised between 700 nm and 1600 nm;
    placing, in the intermediate space, a fluid guide forming composition in contact with the optical source and with the optical fiber, the guide forming composition comprising a first monomer, a first photoinitiator system able to activate the polymerization of the first monomer when illuminated with the first light, and a second photoinitiator system being able to activate the polymerization of the first monomer when illuminated with a second light having a second peak wavelength, the second photoinitiator system not interacting with the first photoinitiator system when the first photoinitiator system is illuminated with the first light, the difference between the first peak wavelength and the second peak wavelength being more than 100 nm;
    injecting the first light in the guide forming composition from the optical source and/or from the optical fiber, to harden a central region of the optical guide by photopolymerization of the first monomer initiated by the first photoinitiator system, the central region connecting the optical source and the optical fiber; and
    illuminating the guide forming composition with the second light to harden a peripheral region of the optical guide by photopolymerization of the first monomer initiated by the second photoinitiator system.

2. The method according to claim 1, wherein the second light has a peak wavelength of strictly less than 650 nm.

3. The method according to claim 1, wherein the first light has a peak wavelength comprised between 700 nm and 900 nm.

4. The method according to claim 1, wherein the first light has a peak wavelength comprised between 1200 nm and 1400 nm.

5. The method according to claim 1, wherein the second light has a peak wavelength of less than 450 nm.

6. The method according to claim 1, wherein the first monomer is an acrylate monomer.

7. The method according to claim 6, wherein the guide forming composition comprises a second acrylate monomer distinct from the first acrylate monomer the first and second acrylate monomer forming a mixture of monomers, the photopolymerization of the mixture of monomers being initiation by first and second initiator in corresponding steps.

8. The method according to claim 7, wherein one of the first and the second acrylate monomers is a diacrylate, the other one of the first and the second acrylate monomers being a triacrylate, the first acrylate monomer comprising an epoxy bisphenol A diacrylate oligomer and the second acrylate monomer comprising a branched triacrylate.

9. The method according to claim 7, wherein both the first and the second acrylate monomers are diacrylates, the first acrylate monomer being an epoxy bisphenol A diacrylate and the second acrylate monomer being a tri-propylene glycol diacrylate.

10. The method according to claim 1, wherein the difference between the optical index along the axis of the optical guide in the central region and at the periphery of the optical guide in the peripheral region after hardening of the central region and of the peripheral region is greater than $5 \times 10^{-4}$.

11. The method according to claim 1, wherein the first photoinitiator system comprises at least a photosensitizer, and an initiator.

12. The method according to claim 1, wherein the injection of the first light is done simultaneously through the optical source and through the optical fiber.

13. The method according to claim 12, wherein the light power density of the first light injected through the optical source is different of more than 20% from the power of the first light injected through the optical fiber.

14. The method according to claim 1, wherein the light power density of the first light injected in the guide forming composition is between 100 W/cm$^2$ and 10 KW/cm$^2$.

15. The method according to claim 1, wherein the optical source is chosen among a VCSEL and an additional optical fiber.

16. The method according to claim 1, wherein the optical fiber is a single mode optical fiber.

17. The method according to claim 1, wherein at least after the injection of the first light, the optical guide is flexible, the method comprising a step of bending the optical guide to form a bend between a first end portion of the optical guide connected to the optical source and a second end portion of the optical guide connected to the optical fiber.

18. A kit for making a self-aligned optical guide between an optical source and an optical fiber, comprising:
    an optical source and an optical guide intended for being arranged facing one another and for defining an intermediate space between them, the optical source being configured to produce a directional emission of a first light having a first peak wavelength comprised between 700 nm and 1600 nm;
    a second light source being configured to emit a second light having a second peak wavelength, the difference between the first peak wavelength and the second peak wavelength being more than 100 nm;

a fluid guide forming composition intended for being placed in contact with the optical source and the optical fiber, the guide forming composition comprising a first monomer, and a first photoinitiator system able to activate the photopolymerization of the first monomer when illuminated with a first light, and a second photoinitiator system being able to activate the polymerization of the first monomer when illuminated with the second light, the second photoinitiator system not interacting with the first photoinitiator system when the first photoinitiator system is illuminated with the first light;

the optical source being able to inject the first light in the guide forming composition, to harden a central region of the optical guide by photopolymerization of the first monomer initiated by the first photoinitiator system, the second light source being able to illuminate the guide forming composition with the second light to harden a peripheral region of the optical guide by photopolymerization of the first monomer initiated by the second photoinitiator system.

* * * * *